United States Patent [19]

Ulczynski et al.

[11] Patent Number: 5,736,818
[45] Date of Patent: Apr. 7, 1998

[54] RESONANT RADIOFREQUENCY WAVE PLASMA GENERATING APPARATUS WITH IMPROVED STAGE

[75] Inventors: Michael J. Ulczynski, Okemos; Donnie K. Reinhard, East Lansing; Jes Asmussen, Okemos, all of Mich.

[73] Assignee: Board of Trustees operating Michigan State University, East Lansing, Mich.

[21] Appl. No.: 616,349

[22] Filed: Mar. 15, 1996

[51] Int. Cl.⁶ .................................................. H05H 1/46
[52] U.S. Cl. ................... 315/111.21; 118/723 MW; 118/728; 156/345; 204/298.15
[58] Field of Search ................. 315/111.21, 111.31, 315/111.41; 118/723 MW, 723 MR, 728; 156/345 MW, 345 WH, 345 PW; 204/298.15; 313/231.31

[56] References Cited

U.S. PATENT DOCUMENTS

| | | | |
|---|---|---|---|
| 4,585,668 | 4/1986 | Asmussen | 427/539 |
| 4,630,566 | 12/1986 | Asmussen et al. | 118/729 X |
| 4,727,293 | 2/1988 | Asmussen et al. | 315/111.41 |
| 4,792,772 | 12/1988 | Asmussen | 333/230 |
| 4,906,900 | 3/1990 | Asmussen | 315/111.81 |
| 4,943,345 | 7/1990 | Asmussen et al. | 118/728 X |
| 5,311,103 | 5/1994 | Asmussen | 315/111.81 |
| 5,382,311 | 1/1995 | Ishikawa et al. | 118/728 X |
| 5,571,577 | 11/1996 | Zhang et al. | 118/723 MW |

FOREIGN PATENT DOCUMENTS 5-36637 2/1993 Japan .................................. 315/111.21

OTHER PUBLICATIONS

Zhang, J., et al., J. Vac. Sci. Technol. A 8 (1990) pp. 2124–2128 No Month.

Primary Examiner—Robert Pascal
Assistant Examiner—Justin P. Bettendorf
Attorney, Agent, or Firm—Ian C. McLeod

[57] ABSTRACT

A plasma (56, 333) generating apparatus (10, 320, 450) wherein a stage (250, 300, 300A, 350, 400, 425) is constructed to keep the plasma on the substrate (S). A pair of electrically, non-conductive tubes (252, 252A, 303, 305, 303A, 305A 403, 405) are mounted on a conductive base plate (253,306,406) having holes (255, 306B) for gas flow and one of the tubes supports a conductive support plate (251, 301, 351, 401) for a substrate (S). An electrically conductive disk (304, 404) between the tubes is provided. An outer conductive tube (307, 418) is preferably used with larger diameter chambers. The stage is designed to prevent the plasma from falling below conductive support plate which preferably mounts a graphite insert (302, 352, 402) which supports the substrate.

22 Claims, 8 Drawing Sheets

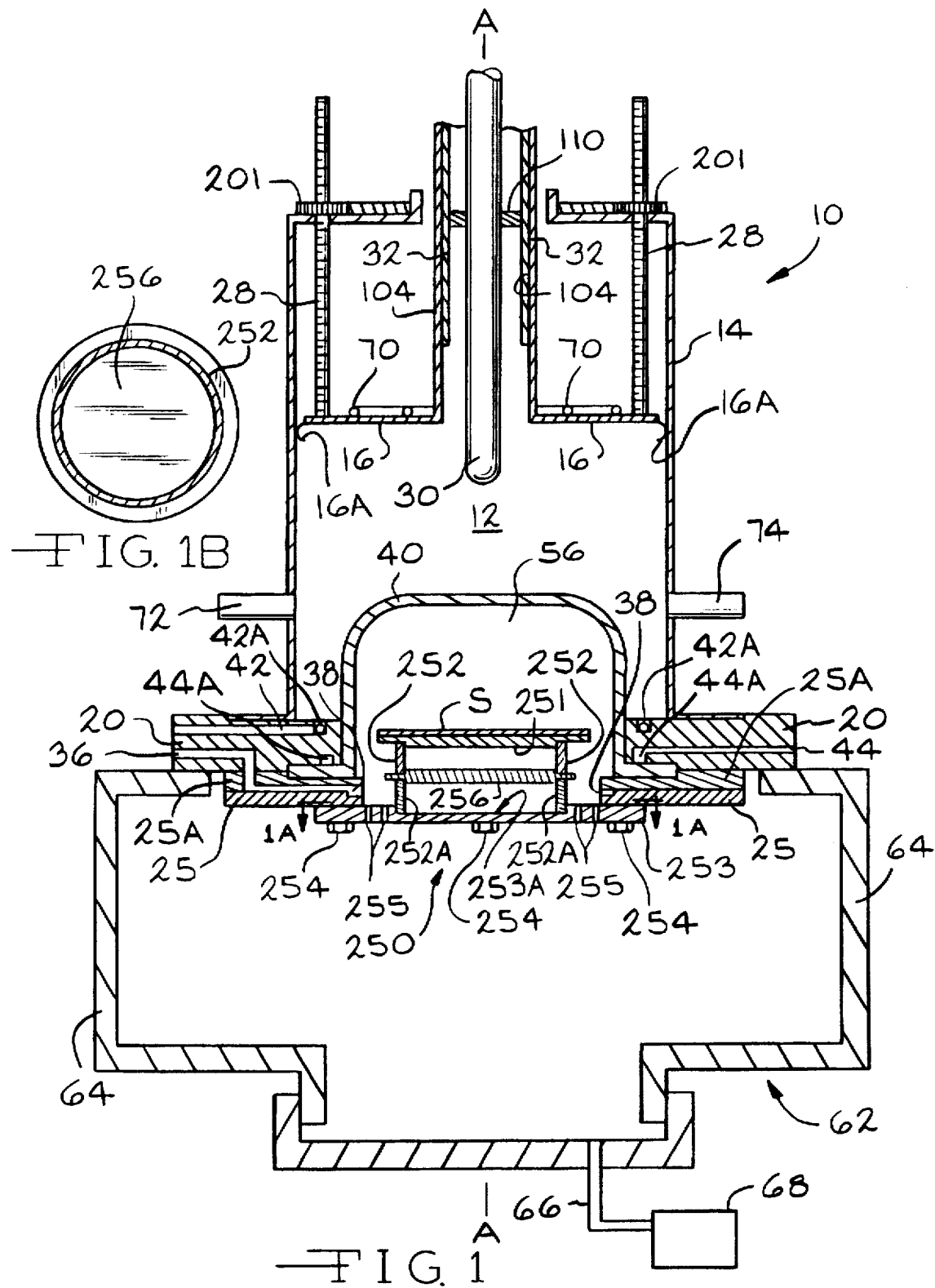

RESONANT RADIOFREQUENCY WAVE PLASMA GENERATING APPARATUS WITH IMPROVED STAGE

BACKGROUND OF THE INVENTION

(1) Field of the Invention

The present invention relates to a resonant radiofrequency wave plasma generating apparatus which has an improved stage which allows treatment of a substrate by a plasma. In particular, the present invention relates to an improved stage which has two non-electrically conductive first and second tubes with an electrically conductive plate mounted between the first and second tubes, wherein the first and second tubes are mounted between a conductive support for the substrate and a conductive base plate having circumferential holes for gas flow during plasma treatment.

(2) Description of Related Art

A microwave disk reactor apparatus for diamond film growth was reported by the present inventors and others (J. Zhang, B. Huang, D. K. Reinhard and J. Asmussen, J. Vac. Sci. Technol. A 8, 2124 (1990)) and tested in a commercial setting. The disk reactor consists of the cylindrical side walls which form the outer conducting shell of the cavity applicator. The water-cooled sliding short, the cavity bottom surface, and the water-cooled base-plate, along with the cavity side walls, form the cylindrical excitation cavity. Input gas flows into the quartz chamber via the input gas channel inside the base-plate. A 92.5 millimeter inside diameter quartz chamber provides a cavity which confines the working gas to the lower section of the applicator where the microwave fields produce a hemisphere shaped plasma adjacent to the substrate. Microwave power is coupled into the cavity through the side-feed coaxial power input probe. A discharge is ignited in the disk shaped zone by exciting the cavity in a single plasma loaded resonant mode. The substrate temperature is measured through a screened top window using an optical pyrometer.

The reactive species in this apparatus covering a surface of 40 millimeters in diameter is uniform. But in this reactor, the power input comes to from the side of the cavity walls and produces an inherent non-uniform electromagnetic field near the excitation probe. This near field effect gets stronger as the input power and quartz disk inside diameter are increased, creating a non-uniform and unstable plasma. Hence, this reactor cannot be used to uniformly deposit diamond on surface areas larger than about 50 millimeters in diameter when operating at pressures above 5 Torr.

A screen is used in the Zhang et al. apparatus to complete the cavity to prevent microwaves from escaping and to allow gas flow. The screen warps and can break allowing microwaves to escape. Also the position of the stage changes because of the warpage. This construction is thus unsuitable for commercial use. The problem is to prevent escape of the microwaves from the cavity.

U.S. Pat. No. 4,906,900 to Asmussen describes an apparatus wherein a probe is aligned parallel to, but offset from the longitudinal axis. The purpose of this invention was to provide a long narrow apparatus for retrofitting existing vacuum sources. There is a suggestion that the apparatus could be used for diamond thin films. U.S. Pat. No. 4,792,772 to Asmussen describes a more conventional commercially available apparatus. The problem is that this apparatus does not provide a completely uniform plasma over large areas at the high pressures (i.e. 5 to 100 Torr) desirable for high growth rates because of the position of the probe. U.S. Pat. No. 4,943,345 to Asmussen and Reinhard shows an apparatus wherein a nozzle is provided to direct the flow of the excited species from the plasma. U.S. Pat. No. 4,691,662 to Roppel, Asmussen and Reinhard describes a dual plasma device. U.S. Pat. No. 4,630,566 to Asmussen and Reinhard; U.S. Pat. No. 4,727,293 to Asmussen, Reinhard and Dahimene; U.S. Pat. No. 4,585,668 to Asmussen show various plasma generating devices. U.S. Pat. No. 5,311,103 to Asmussen et al. shows an apparatus where the probe is parallel to the longitudinal axis of the apparatus, which, as indicated, above, is preferred for the present invention.

OBJECTS

It is an object of the present invention to provide an improved stage for plasma deposition or etching. These and other objects will become increasingly apparent by reference to the following description and the drawings.

DESCRIPTION OF THE DRAWINGS

FIG. 1 is a front cross-sectional view of a tuneable microwave apparatus 10 with an improved stage 250 for mounting the substrate S.

FIG. 1B is a plan view of the conductive disk 256.

DESCRIPTION OF PREFERRED EMBODIMENTS

Figure 1A:
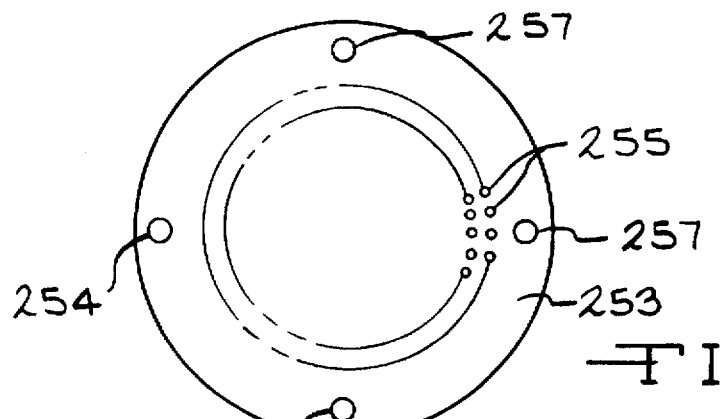
FIG. 1A is a top plan view of the base plate 253 shown in FIG. 1 particularly illustrating the rings of openings 255 for gas flow and which provide microwave containment.

The present invention relates to a plasma generating apparatus for treating a substrate including a plasma source employing a radiofrequency, including UHF or microwave, wave coupler means which is metallic and in the shape of a hollow cavity and which is excited in a mode of resonance and optionally including a static magnetic field around the plasma which aids in coupling radiofrequency energy at electron cyclotron resonance and aids in confining ions in the plasma in an electrically insulated chamber means mounted in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radiofrequency wave applied to the coupler means creates and maintains the plasma around the central longitudinal axis in the chamber means; and a stage means which forms part of the cavity and projects into the chamber means at the one end and provides for mounting a substrate on the chamber means, the stage means having a support surface which is in a plane around the longitudinal axis, the improvement in the stage means which comprises: an electrically conductive plate with an upper surface for supporting the substrate and an opposed lower surface; an electrically non-conductive first tube with a first end which mounts conductive plate on the lower surface; a conductive disk with opposed sides with the first tube mounted on one of the opposed sides; an electrically non-conductive second tube mounted on the disk on the other of the opposed sides; and a conductive baseplate which mounts the conductive second tube and having circumferentially positioned holes adjacent an outside wall of the second tube allowing flow of the gas and preventing radiofrequency waves from escaping through the holes, wherein the stage means projects into the chamber means and wherein the probe means and moveable plate means can be positioned so that the plasma is contacting the substrate and is off of the stage means except at the conductive plate. The holes in the base plate are preferably about 0.16 to 0.64 cm (¹⁄₁₆ to inch) in diameter.

Further, the present invention relates to a plasma generating apparatus for treating a substrate including a plasma source employing a radiofrequency, including UHF or microwave, wave coupler means which is metallic and in the shape of a hollow cavity and which is excited in a TM mode of resonance and optionally including a static magnetic field around the plasma which aids in coupling radiofrequency energy at electron cyclotron resonance and aids in confining ions in the plasma in an electrically insulated chamber means mounted in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radiofrequency wave applied to the coupler means creates and maintains the plasma around the central longitudinal axis in the chamber means; movable metal plate means in the cavity mounted in the coupler means perpendicular to the central longitudinal axis and movable along the central longitudinal axis towards and away from the chamber means; and a movable probe means connected to and extending inside the coupler means for coupling the radiofrequency waves to the coupler means, wherein the probe means which is elongate and is mounted in the coupler means along the central longitudinal axis of the chamber means and coupler means, with an end of the probe means in spaced relationship to the chamber means and wherein the plate means having an opening along the central longitudinal axis of the chamber means, wherein the plate means supports the probe means so that the probe means can be moved in the opening in the plate means along the central longitudinal axis the improvement which comprises: a stage means which forms part of the cavity and provides for mounting a substrate to be treated with the material, the stage means comprising an electrically conductive plate with an upper surface for supporting the substrate and an opposed lower surface having a central portion which projects away from the lower surface; a non-electrically conductive first tube with opposed ends with a first of the ends mounting the conductive plate with the central portion projecting into the first tube; a conductive disk with opposed sides and with central opposed raised portions so that one of the raised portions project into the first tube; an electrically non-conductive tube mounted on the conductive disk so that the other of the raised portions project into the second tube; a conductive plate which supports the second tube with a central portion having a recess which mounts a portion of the second tube, the conductive plate having circumferentially positioned holes adjacent an outside wall of the second tube allowing flow of the gas and preventing radiofrequency waves from escaping through the holes, wherein the stage means projects into the chamber means and wherein the probe means and moveable plate means can be positioned so that the plane is contacting the substrate and is off of the stage means except at the conductive plate; and vacuum means for providing a vacuum in the chamber means through the holes in the base plate.

Further still, the present invention relates to a method for treating a substrate which comprises: providing a plasma generating applicator in a plasma generating apparatus for treating a substrate including a plasma source employing a radiofrequency, including UHF or microwave, wave coupler means which is metallic and in the shape of a hollow cavity and which is excited in a TM mode of resonance and optionally including a static magnetic field around the plasma which aids in coupling radiofrequency energy at electron cyclotron resonance and aids in confining ions in the plasma in an electrically insulated chamber means mounted in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radiofrequency wave applied to the coupler means creates and maintains the plasma around the central longitudinal axis in the chamber means; movable metal plate means in the cavity mounted in the coupler means perpendicular to the central longitudinal axis and movable along the central longitudinal axis towards and away from the chamber means; and a movable probe means connected to and extending inside the coupler means for coupling the radiofrequency waves to the coupler means, wherein the probe means which is elongate and is mounted in the coupler means along the central longitudinal axis of the chamber means and coupler means, with an end of the probe means in spaced relationship to the chamber means and wherein the plate means having an opening along the central longitudinal axis of the chamber means, wherein the plate means supports the probe means so that the probe means can be moved in the opening in the plate means along the central longitudinal axis the improvement which comprises: a stage means which forms part of the cavity and provides for mounting a substrate to be treated with the material, the stage means comprising an electrically conductive plate with an upper surface for supporting the substrate and an opposed lower surface having a central portion which projects away from the lower surface; a non-electrically conductive first tube with opposed ends with a first of the ends mounting the conductive plate with the central portion projecting into the first tube; a conductive disk with opposed sides and with central opposed raised portions so that one of the raised portions projects into the first tube; an electrically non-conductive tube mounted on the conductive disk so that the other of the raised portions projects into the second tube; a conductive plate which supports the second tube with a central portion having a recess which mounts a portion of the second tube, the conductive plate having circumferentially positioned holes adjacent an outside wall of the second tube allowing flow of the gas and preventing radiofrequency waves from escaping through the holes, wherein the stage means projects into the chamber means and wherein the probe means and moveable plate means can be positioned so that the plane is contacting the substrate and is off of the stage means except at the conductive plate; and vacuum means for providing a vacuum in the chamber means through the holes in the base plate; treating the substrate with the plasma, wherein the stage means projects into the chamber means and wherein the probe means and movable plate means are positioned so that the plasma is contacting the substrate.

The present invention provides a novel stage for concentrating the plasma on the substrate being coated, etched or otherwise treated by the plasma. The stage includes non-conductive tube with a conductive disk between the ends. This construction allows the plasma to be in the correct position when operating with lower pressures or higher substrates.

The stages described hereinafter were developed as a result of considerable experimentation. It is not understood exactly why the microwaves can be tuned to keep the plasma essentially off the stage. It is believed that the unique configuration of conductive base plate; non-conductive tube, conductive disk, and conductive support plate which supports the substrate, produces this result.

FIG. 1 shows a plasma coating apparatus 10 used in the present invention as described in U.S. Pat. No. 5,311,103 to Asmussen et al with an improved stage 250 as described hereinafter. The principal components of the apparatus 10 are displayed in the longitudinal front cross-sectional view of FIG. 1. The cavity 12 preferably has a 178 millimeter inside diameter and is an open ended metallic cylinder 14. A sliding short 16, which is electrically connected to the sidewalls via the finger stocks 16A, forms the top end of the cavity 12. The lower section of the cavity 12 consists of a metal base plate 20, an intermediate ring plate 25A and a bottom plate 25. The sliding short 16 cooled by water lines 70 can be moved back and forth along the longitudinal axis A—A of the cavity 12 by the threaded moving rods 28, which provides an adjusting means for an excitation probe 30. Air inlet 72 and outlet 74 provide cooling. The probe 30 is supported in an inner sleeve 104 by an insulator 110. The inner sleeve 104 provides a holder means for the probe 30 and is in turn adjustably mounted inside of a short sleeve 32. The short sleeve 32 along with the sliding short 16 are adjustable with respect to the metallic cylinder 14 by gears 201 on top of the apparatus 10 which rotate on rods 28. The inner sleeve 104 moves longitudinally along axis A—A to adjust the distance between the probe 30 and a quartz disk chamber 40.

The adjustable sliding short 16 and the excitation probe 30 provide the impedance tuning mechanism to minimize the reflected power in the cavity 12. The source gas, which is supplied through the source gas inlet 36 and annular source gas ring 38, is confined at the lower section of the cavity 12 by the quartz disk chamber 40. The base-plate 20 and quartz disk chamber 40 are cooled by the water cooling channel 42 and gas cooling channel 44 through the annular water cooling rings 42A and gas cooling rings 44A. Air cooling inlet 72 and outlet 74 provide air or another gas to cool the chamber 40, cylinder 12 and probe 30.

The substrate S to be coated is positioned on top of a stage 250. A conductive plate 251 is supported by non-metallic tubes 252 and 252A with a conductive disk 256 between them. A conductive base plate 253 supports tube 252A and is secured by bolts 254 to bottom plate 25. A ring of openings 255 is provided through the base plate 253 for flow of gas from the chamber The tubes 252 and 252A and disk 256 ensure that the plasma 56 stays on top of the substrate S by breaking the resonance near the base plate 253. This design minimizes the plasma 56 volume by creating the plasma 56 adjacent to the substrate S. The cylindrical symmetry of the sliding short 16 and probe 30 and system configuration ensures that the plasma 56 generated has an inherent cylindrical symmetry. The apparatus 10 is mounted on a vacuum chamber 62 with chamber walls 64 and a chamber conduit 66 leading to a vacuum pump 68. Holes 257 are used for bolts 254.

Figure 2:
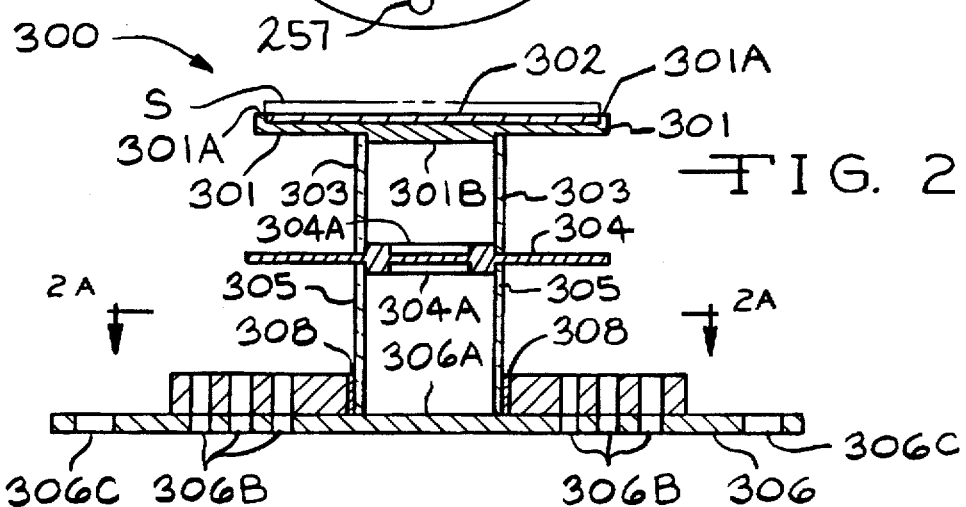
FIG. 2 is a front cross-sectional view of a preferred stage 300.
Figure 2A:
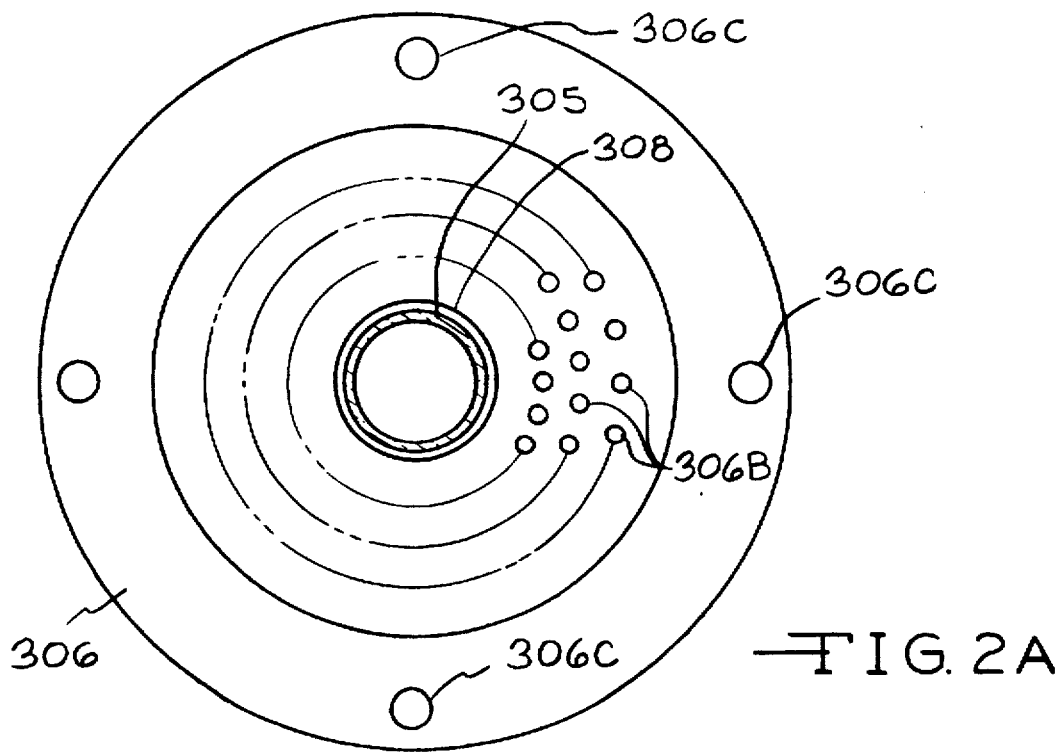
FIG. 2A is a top plan view of the base plate 306 shown in FIGS. 2 and 6 as a section 2A—2A of FIG. 2, particularly illustrating the ring of openings 306B with the tube 305 in position and with a space 308 between the base 306 and non-conductive tube 305.

FIGS. 2 and 2A show an improved stage 300 including an electrically conductive, cylindrical support plate 301 (metal, preferably stainless steel) mounting a circular first disk 302 (graphite). The plate 301 includes a circular lip 301A and a circular extension 301B which extends into an opening of cylindrical non-electrically conductive, cylindrical first tube 303 (quartz). The first tube 303 is mounted on a second circular graphite disk 304 with extensions 304A which is in turn mounted on a non-electrically conductive cylindrical second tube 305 (quartz). The tube 305 is mounted on a conductive base plate 306 in a recess 306A. The plate 306 has rings of parallel openings 306B (⅛ inch; 0.32 cm in diameter) for gas flow. The base plate 306 has an outer recessed ring which is secured to the microwave reactor in the manner shown in FIG. 6. A space 308 is provided between tube 305 and base plate 306 to allow for heating. Holes 306C are used for bolts (not shown) like bolts 254 as in FIG. 1.

Figure 3:
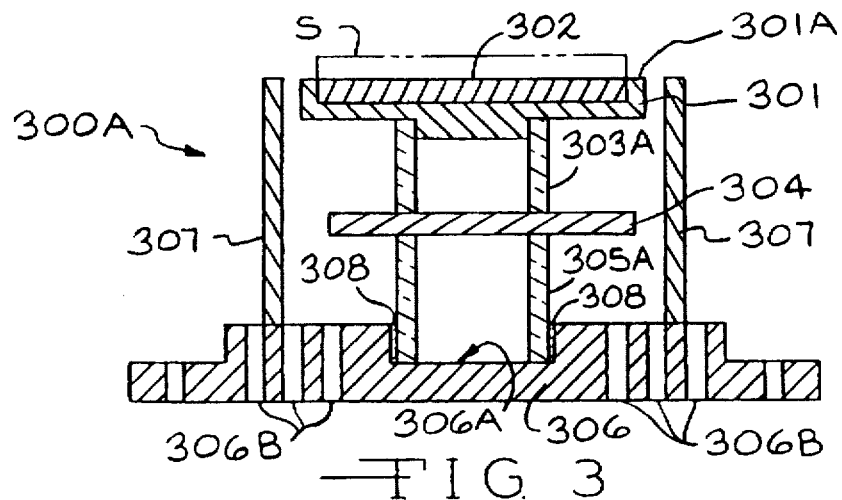
FIG. 3 is a front cross-sectional view of a stage 300A which is a modification of the stage 300 of FIG. 2.
Figure 3A:
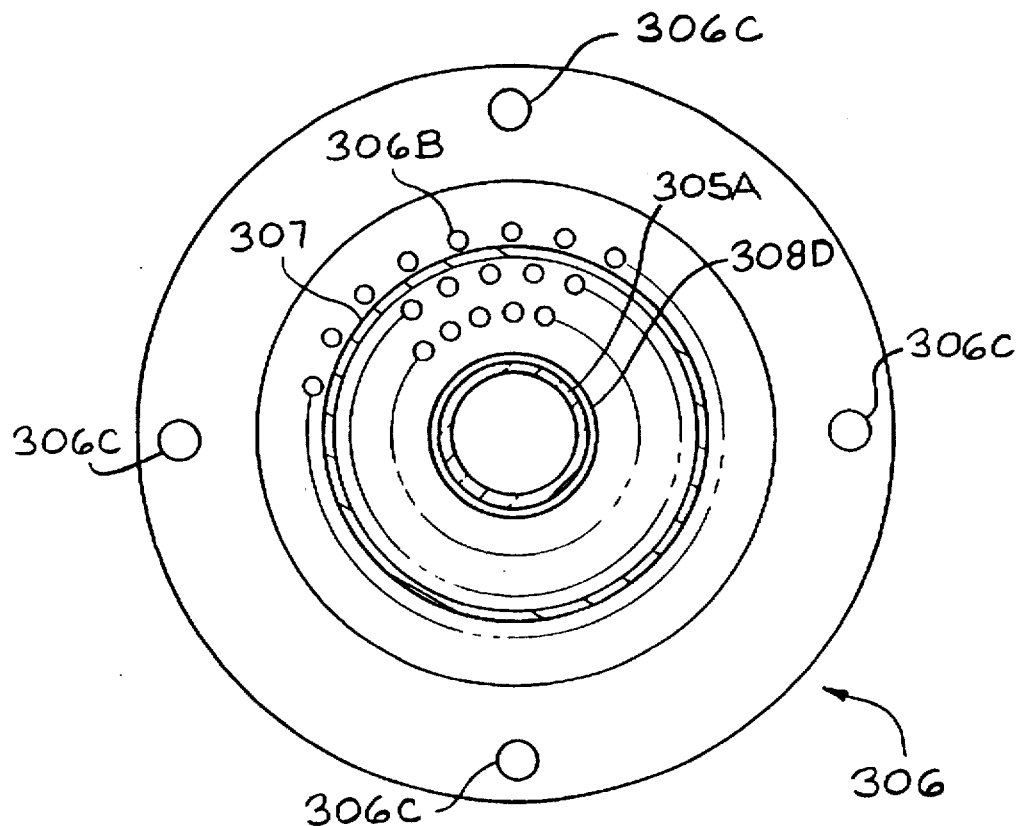
FIG. 3A is a top plan view of the base plate 306 shown in FIG. 3 and in FIG. 7 as a section 3A—3A of FIG. 3 with the non-conductive tube 305A and metal tube 307.

FIGS. 3 and 3A show a stage 300A which is a variation of stage 300 of FIG. 2, wherein a conductive metal tube 307 is mounted around the stage 300. The outer conductive (metal) tube 307 provided improved results in larger chambers 40 (12.5 cm, 5 inches in diameter). The non-conductive tubes 303A and 305A are of different lengths than as shown in FIG. 2. With small reactors (chamber 40 less than 10 cm in diameter), the plasma could not be ignited.

Figure 4:
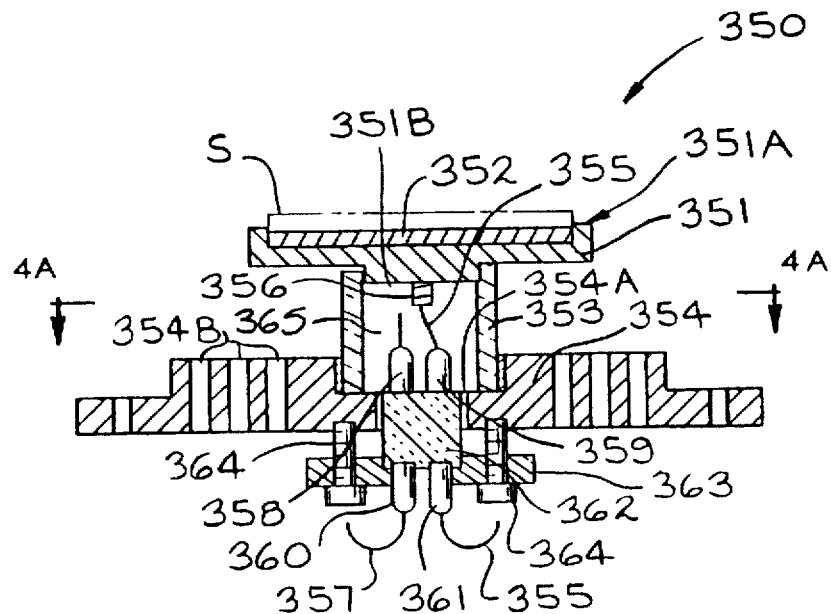
FIG. 4 is a front cross-sectional view of a stage 350 with a positive base wire 355 leading to a conductive plate 351.
Figure 4A:
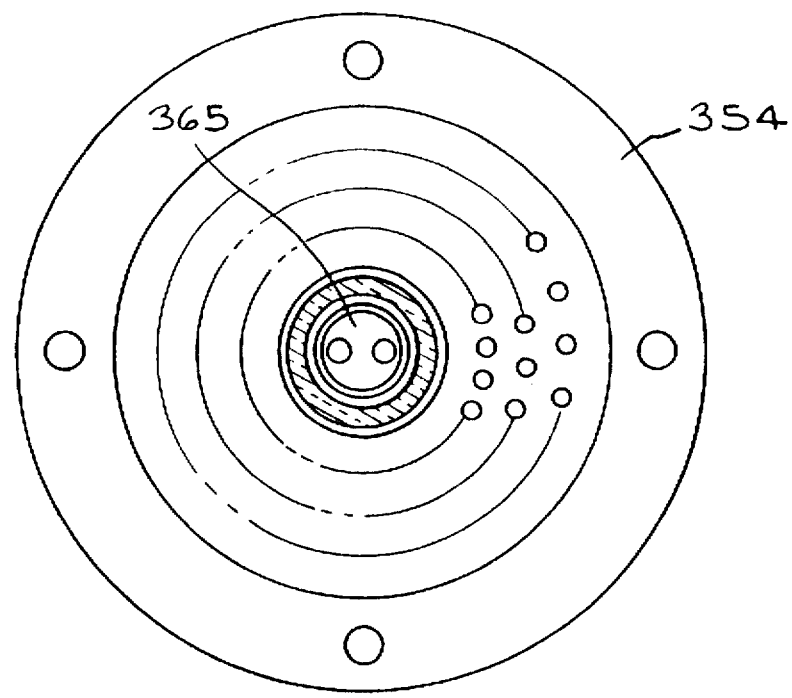
FIG. 4A is a top plan view of the base plate 406 as a section 4A—4A of FIG. 4 including a central opening 365 for an insulating support 362.

FIGS. 4 and 4A show a stage 350 adapted for an electrical bias. There is a cylindrical, conductive plate 351 mounting a graphite disk 352. The plate 351 includes a circular lip 351A around the graphite disk 352. An extension 351B of the plate 351 extends into a non-conductive tube 353 (quartz) which is mounted on a base plate 354 in a recess 354A. The base plate has rings of parallel openings 354B (⅛"; 0.32 cm in diameter). A positive bias wire 355 is connected to the conductive plate 351 by a connector 356. A negative bias wire 357 is positioned in the space 365 inside tube 353. The wires 355 and 357 are mounted through insulators 358 and 360 and insulators 359 and 361 mounted on a non-conductive support 362 (quartz). The support 362 is secured in place by disk 363 and held in place by a ring of bolts 364 (two shown) in an opening 365 (FIG. 4A). This apparatus could not ignite a plasma useful for diamond deposition in a small reactor (chamber 40 less than 10 cm in diameter).

Figure 5:
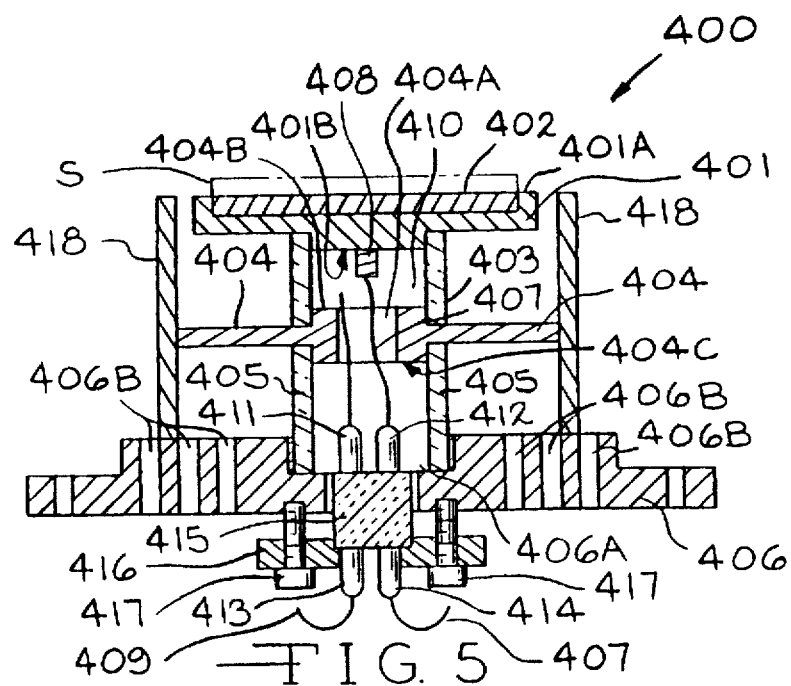
FIG. 5 is a front cross-sectional view of a stage 400 using the base plate 406 which is identical to base plate 354 of FIG. 4 including an outer conductive tube 418.

FIG. 5 shows a stage 400, which is a variation of the stage 350 shown in FIG. 4, with an electrical bias. A conductive plate 401 mounts a graphite disk 402. The plate 401 includes a circular lip 401A around graphite disk 402 and an extension 401B which extends into a non-conductive first tube 403 (quartz). An electrically conductive disk 404 is mounted on an end of the tube 403 opposite the plate 401. The disk 404 has an opening 404A and a first extension 404B which fits into tube 403. The disk 404 includes a second extension 404C which fits inside a non-conductive second tube 405. The second tube 405 fits into base plate 406 in recess 406A. Ring of parallel openings 406B (⅛"; 0.32 cm) are provided around the base plate 406. A positive bias wire 407 is connected to the conductive plate 401 by a connector 408. A negative bias wire 409 is positioned in space 410 inside tube 403. The wires 407 and 409 are mounted through insulator 411 and 413 and insulator 412 and 414 mounted on a non-conductive support 415 (quartz). The support 415 is secured in place by a retaining disk 416 and held in place by ring bolts 417 (two shown). An outer conductive tube 418 is provided around the tubes 403 and 405 and disk 404. This stage was particularly effective with large diameter chambers 40 (greater than 12 cm in diameter).

Figure 6:
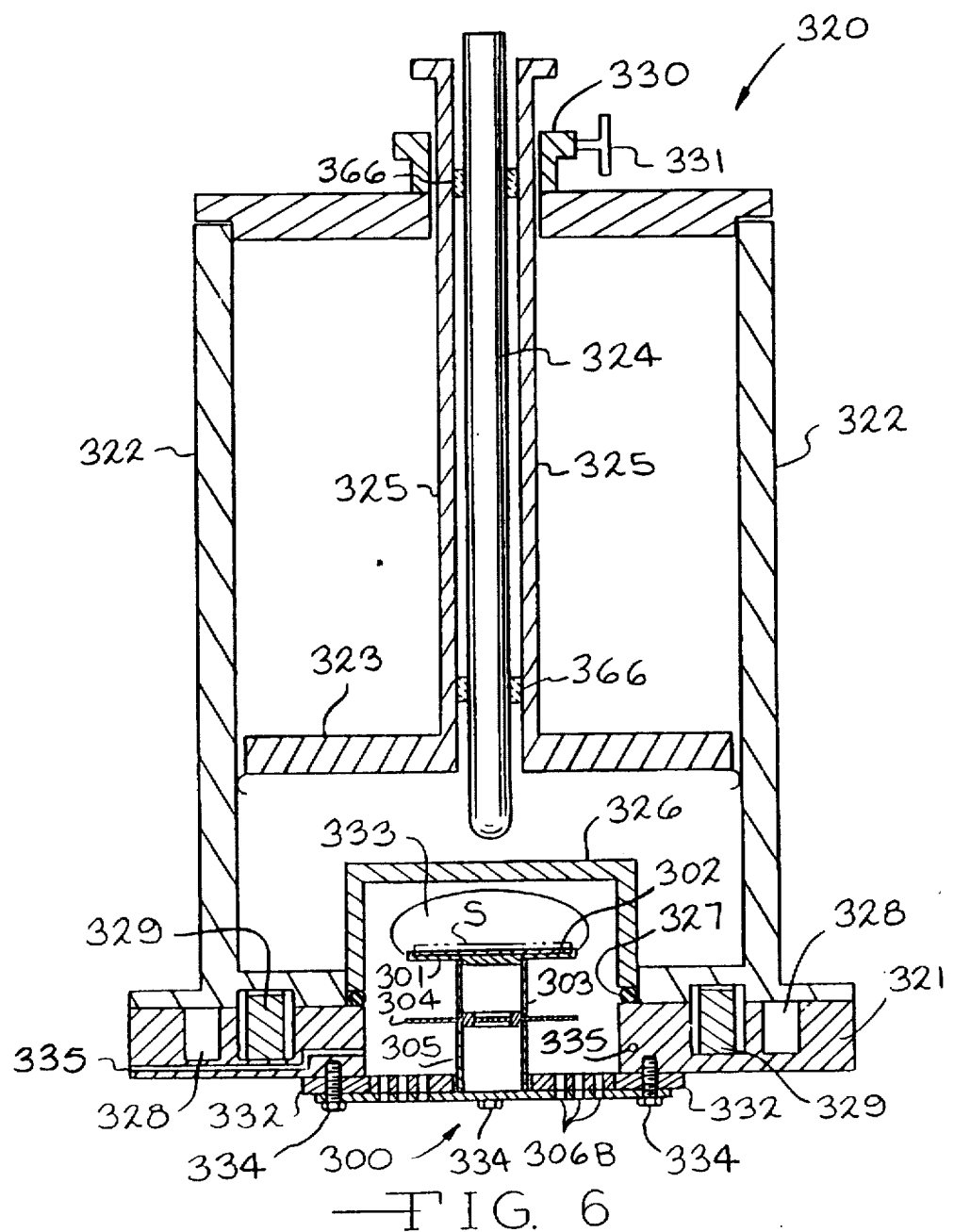
FIG. 6 is a front cross-sectional view of a tuneable applicator 320 with magnets 329 which can provide electron cyclotron resonance (ECR) at low pressures.

FIG. 6 schematically shows the stage 300 as in FIG. 2 mounted on a reactor apparatus 320, including a base plate 321, cavity 322, sliding short 323, probe 324, inner sleeve 325 (which is an extension of sliding short 323), disk chamber 326 and ring seal 327. The base plate 321 is cooled by cooling rings 328 and reactive gas feed 335. Electron cyclotron resonance can be achieved with ring magnets 329 as in FIG. 5 of U.S. Pat. No. 5,311,103 of Asmussen et al. if low pressures (less than 1 torr) are used. The probe 324 is manually adjusted with a gear set 330 by handle 331. The base plate 306 is secured to base 321 by a conductive ring 332 using bolts (334). The plasma 333 is generated over the graphite disk 302 and substrate S. Insulator 366 is provided for probe 324.

Figure 7:
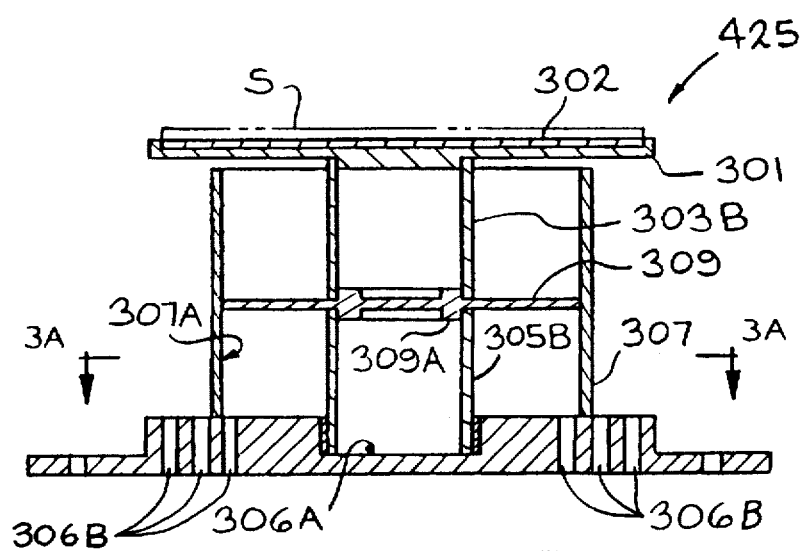
FIG. 7 is a front view of a stage 425 having a preferred positioning of the conductive support plate 301. The conductive base plate 306 of FIG. 3 is used.

FIG. 7 is a front view of a stage 425 showing the base plate 306, non-conductive tubes 303B and 305B and a graphite disk 309 which touches an inside wall 307A of conductive tube 307. The tube 303B extends above the tube 307 and supports the conductive plate 301 with the graphite disk 302. The disk 302 supports the substrate S.

Figure 8:
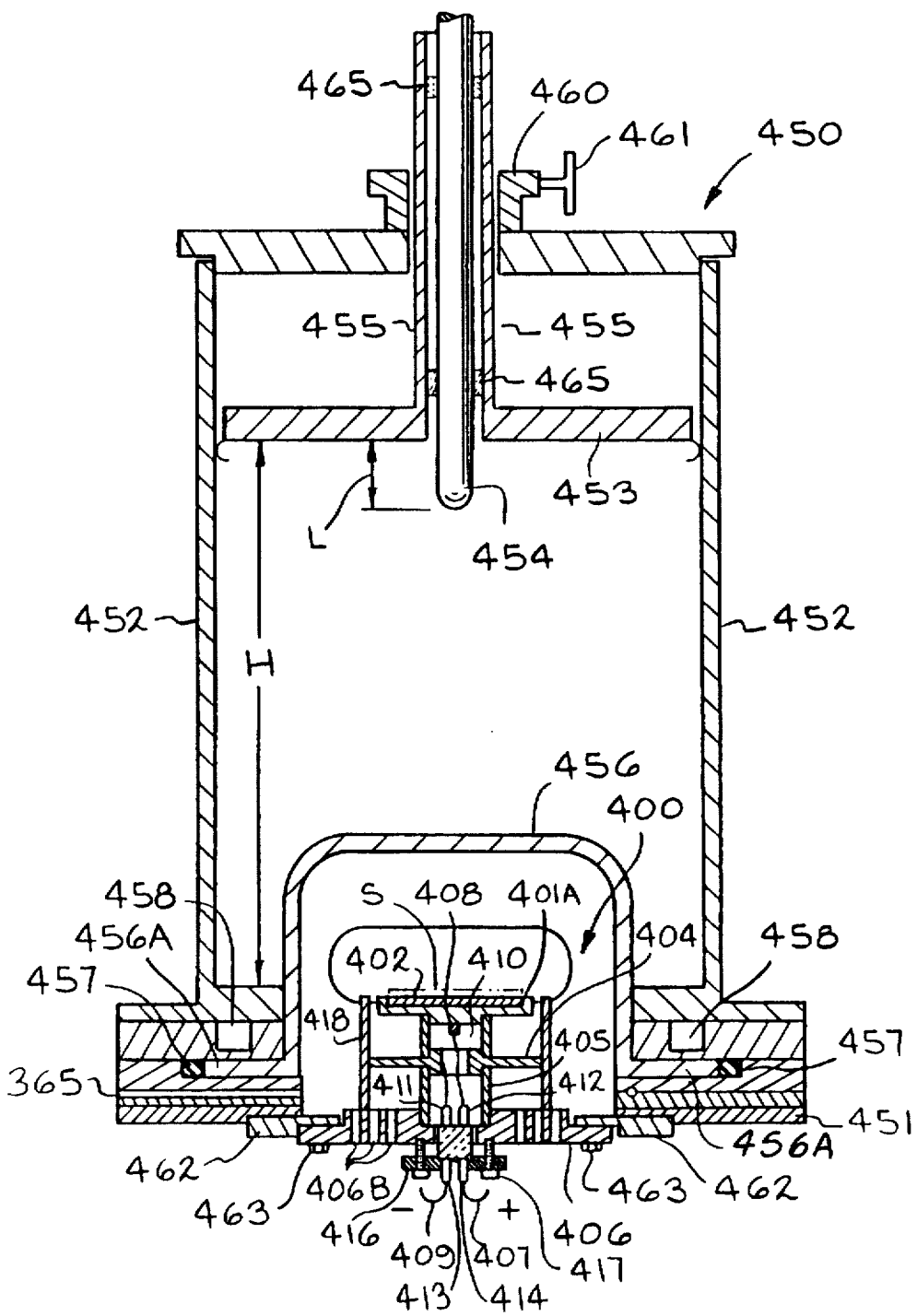
FIG. 8 is a front view of an applicator 450 with the stage 400 of FIG. 5 in position.
Figure 9:
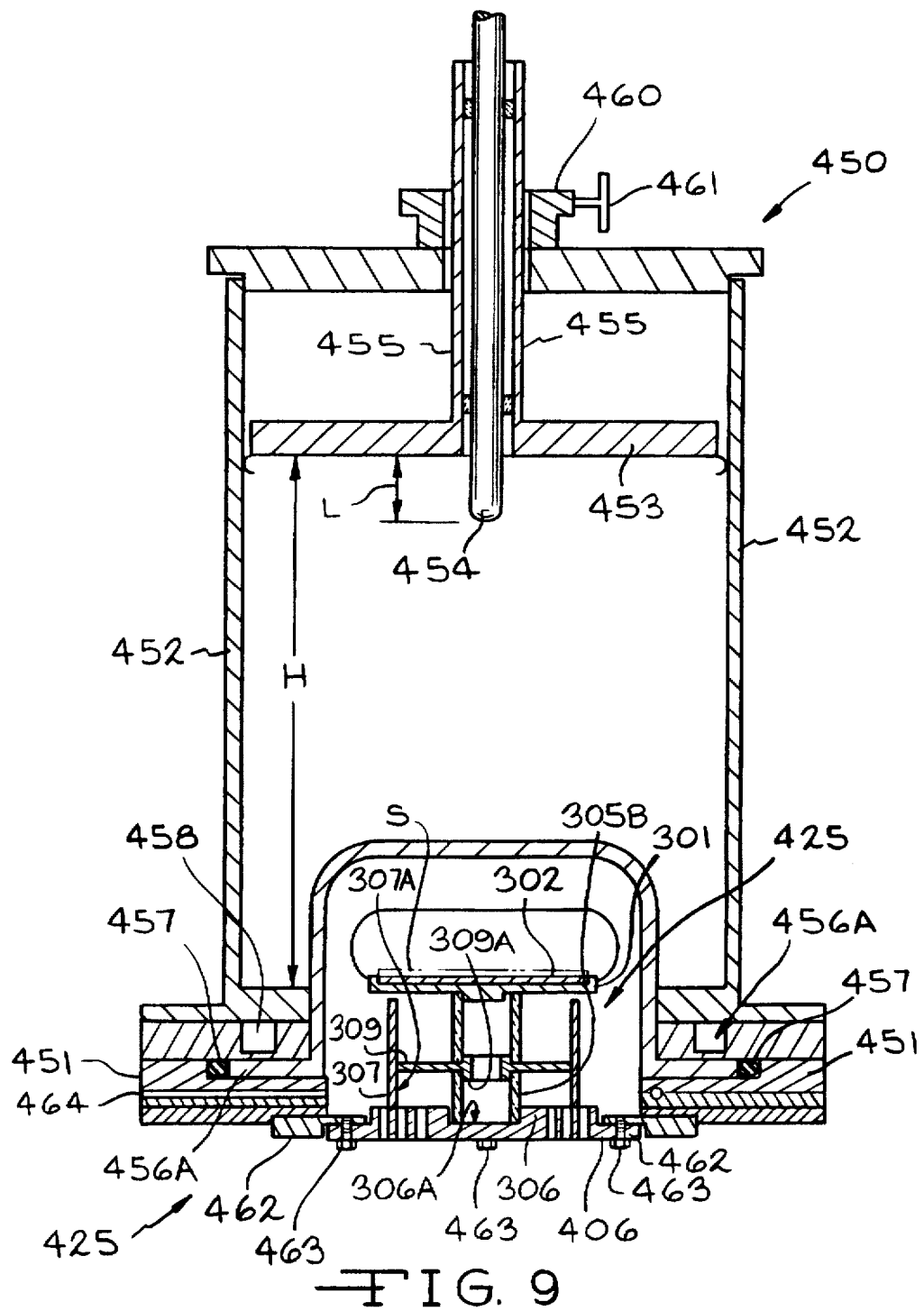
FIG. 9 is a front view of an applicator 450 with the stage 425 of FIG. 7 in position.

FIGS. 8 and 9 show an applicator 450 used with the stages 400 and 425 shown in FIGS. 5 and 7. The applicator 450 is similar to the applicator 320 shown in FIG. 6 except there are no optional magnets 329 and it is larger (12.5 cm in diameter). The applicator includes a base plate 451, cavity 452, sliding short 453, probe 454, inner sleeve 455 which is an extension of sliding short 453, chamber 456 and ring seal 457. The chamber 456 has a lip 456A which engages the seal 457. The base plate 451 is cooled by cooling ring 458. The probe 454 is manually adjusted by a gear set 460 using a handle 461. The base plates 406 of stages 400 or 425 are secured to the applicator 450 through a metal ring 462 by means of bolts 463. Gas flow is provided by channels 464. The mode used was $TM_{o13}$. Insulator 465 is provided for the probe 324.

Table 1 shows representative dimensions (inches) for the parts of the stages of FIGS. 2 and 7.

TABLE 1

| Dimensions | Radius | Thickness | Height |
|---|---|---|---|
| (FIG. 2) | | | |
| Conductive plate 301; | 1.094 | 0.125 | |
| Tubes 303, 305 | 0.453 O.D. | | 0.781 |
| | 0.391 I.D. | | |
| Disk 304 | 1.094 | 0.063 | |
| Extensions 304A | | 0.063 | |
| Base 306 | 2.313 | 0.125 | |
| Recess 306A | 0.5 | | |
| (FIG. 7) | | | |
| Conductive plate 306 | 1.578 | 0.125 | |
| Tubes 303B, 305B | 0.453 O.D. | | |
| | 0.391 I.D. | | 0.875 |
| Disk 309 | 1.125 | 0.063 | |
| Extensions 309A | 0.391 | | |
| Outer Tube 307 | 1.188 O.D. | | 1.563 |
| | 1.125 I.D. | | |
| Base 306 | 2.313 | 0.125 | |
| Recess 306A | 0.5 | | |
| Holes 306B | 0.0625 | | |

In the following Examples, diamond thin films were deposited on glass and on integrated circuit substrates.

EXAMPLE 1

A 2.45 GHz microwave source with a center probe 30 as shown in FIG. 1 was used. For most of the diamond film depositions on glass and integrated circuits the gas composition was 200 sccm hydrogen, 8 sccm carbon dioxide, and 3 sccm methane for a ratio of 100:4:1.5 to 2.0 for the three gases. Diamond film was deposited at temperatures of 600° to 700° C. with gas ratios of 100:4:2, respectively. Diamond films were also deposited using ratios 95:4:2 and 100:4:1.5. The modes were $TM_{o11}$ or $TM_{o13}$.

Gas flows of 200:8:3 were found to give good results. Other sources of oxygen such as CO and $O_2$ have been reported in the literature and can be used. Also, halogens have been reported in the literature to improve deposition rate at low temperatures. $CF_4$ can be substituted for $CH_4$.

Films were deposited on glass using two seeding methods, scratching with diamond powder or coating with diamond seeds suspended in photoresist. Most of the glass deposition was done with the diamond seeds in photo resist. The integrated circuit substrate was done with the diamond seeds and photoresist since damage of the substrate by scratching or ultrasonic bombardment is unacceptable.

The substrate was supported on stage 250 or 300 as shown in FIGS. 1, 2 and 6. It was found that good coatings were produced.

EXAMPLE 2

The substrate stage 300A or 425 was modified to include a metal tube 307 as illustrated in FIGS. 3 and 7 in an applicator 450 as shown in FIG. 9 using the conditions of Example 1. The mode was $TM_{o13}$. This facilitated the coating of larger substrates. Several 1.5 and 2 inch diameter pieces of glass were coated, as well as 2 inch (5 cm) diameter silicon pieces. A 2 inch diameter silicon wafer patterned with integrated circuits was coated with a diamond film using this configuration. Good coatings were produced.

EXAMPLE 4

The stage 400 as shown in FIGS. 5 and 8. The $TM_{o13}$ mode was used. Deposition experiments were performed with 3 inch and 4 inch diameter silicon wafers with temperatures in the range of 400° to 500° C. Good coatings were produced.

The stage 300 of FIGS. 2 and 6 was used in a small (4 inch (10.2 cm) diameter) chamber 326 reactor apparatus to coat 2 inch (5 cm) diameter substrates including silicon, glass, and IC processed silicon.

The stage 300A of FIG. 3 was used in the larger (5 inch (12.7 cm) diameter) chamber 356 of the reactor apparatus 450, but does not have an advantage over other stages. In fact, the graphite disk 304 which is necessary in the small reactor does not appear to be necessary in this larger reactor. The stage 350 did not work in the smaller (4 inch, 10.2 cm) reactor apparatus 320 of FIG. 6.

The stage 350 of FIG. 4 with the bias was used in the small reactor apparatus 370 of FIG. 6.

The stage 400 of FIG. 5 was used in the larger (5 inch (12.7 cm) diameter) reactor apparatus 450. The depositions were performed with and without an applied dc bias. The stage 350 worked in all experiments. In the larger reactor, the outer tube 418 played an important role even without the bias. FIG. 7 shows how the stage 400 of FIG. 5 was modified for 3 inch (7.6 cm) diameter substrates in the large reactor apparatus 450 (5 inch, 12.7 cm). This stage 425 does not include a bias and uses both a conductive disk and a conducting outer tube.

In the larger reactor apparatus 450, the conductive disk 404 alone does not work to control the plasma. The stage 300 of FIG. 2 does not work in the larger reactor 450 but it does in the smaller reactor 320. In the larger reactor apparatus 450 what appears to be important is the outer tube 307. The tube 307 works with the tube 307 and the disk 309, but not with the disk 309 only.

It is intended that the foregoing description be only illustrative of the present invention and that the present invention be limited only by the hereinafter appended claims.

We claim:

1. In a plasma generating apparatus for treating a substrate including a plasma source employing a radiofrequency, including LIEF or microwave, wave coupler means which is metallic and in the shape of a hollow cavity and which is excited in a mode of resonance in an electrically insulated chamber means mounted in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radiofrequency wave applied to the coupler means creates and maintains the plasma around the central longitudinal axis in the chamber means; and a stage means which forms part of the cavity and projects into the chamber means at the one end and provides for mounting a substrate on the chamber means, the stage means having a support surface which is in a plane around the longitudinal axis, the improvement in the stage means which comprises:

(a) an electrically conductive support plate with an upper surface for supporting the substrate and an opposed lower surface;
   (b) an electrically non-conductive first tube with a first end which mounts the conductive support plate on the lower surface;
   (c) a conductive disk with opposed sides with the first tube mounted on one of the opposed sides;
   (d) an electrically non-conductive second tube mounted on the disk on the other of the opposed sides; and
   (e) a conductive base plate which mounts the conductive second tube and having circumferentially positioned holes adjacent an outside wall of the second tube allowing flow of the gas and preventing radiofrequency waves from escaping through the holes, wherein the wave coupler means can be positioned so that the plasma is contacting the substrate and is off of the stage means except at the conductive base plate.

2. The apparatus of claim 1 wherein the coupler means is shaped as a cylinder around the central longitudinal axis.

3. The apparatus of claim 1 wherein a conductive outer tube surrounds the disk and the first and second tubes.

4. The apparatus of claim 3 wherein the disk is in closely spaced relationship to the outer tube.

5. The apparatus of claim 3 wherein the disk contacts an inner surface of the outer tube.

6. The apparatus of claim 3 wherein the conductive support plate extends above the conductive outer tube into the region of the plasma.

7. The apparatus of claim 1 wherein electrical means for providing a positive bias to the substrate is connected to the conductive base plate through the first and second tubes and disk.

8. The apparatus of claim 1 wherein a graphite insert is mounted on the support plate to be in contact with the substrate.

9. The apparatus of claim 1 wherein a static magnetic field is provided around the plasma in the electrically insulated chamber means.

10. In a plasma generating apparatus for treating a substrate including a plasma source employing a radiofrequency, including LIEF or microwave, wave coupler means which is metallic and in the shape of a hollow cavity and which is excited in a TM mode of resonance in an electrically insulated chamber means mounted in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radiofrequency wave applied to the coupler means creates and maintains the plasma around the central longitudinal axis in the chamber means; movable metal plate means in the cavity mounted in the coupler means perpendicular to the central longitudinal axis and movable along the central longitudinal axis towards and away from the chamber means; and a movable probe means connected to and extending inside the coupler means for coupling the radiofrequency waves to the coupler means, wherein the probe means which is elongate and is mounted in the coupler means along the central longitudinal axis of the chamber means and coupler means, with an end of the probe means in spaced relationship to the chamber means and wherein the moveable metal plate means having an opening along the central longitudinal axis of the chamber means, wherein the moveable metal plate means supports the probe means so that the probe means can be moved in the opening in the moveable metal plate means along the central longitudinal axis the improvement which comprises:

(a) a stage means which forms part of the cavity and provides for mounting a substrate to be treated with the material, the stage means comprising an electrically conductive first plate with an upper surface for supporting the substrate and an opposed lower surface having a central portion which projects away from the lower surface; an electrically non-conductive first tube with opposed ends with a first of the ends mounting the conductive first plate with the central portion projecting into the first tube; a conductive disk with opposed sides and with central opposed raised portions so that one of the raised portions project into the first tube; an electrically non-conductive second tube mounted on the conductive disk so that the other of the raised portions project into the second tube; an electrically conductive second plate which supports the second tube with a central portion having a recess which mounts a portion of the second tube, the conductive second plate having circumferentially positioned holes adjacent an outside wall of the second tube allowing flow of the gas and preventing radiofrequency waves from escaping through the holes, wherein the stage means projects into the chamber means and wherein the probe means and the moveable metal plate means can be positioned so that the plane is contacting the substrate and is off of the stage means except at the conductive plate; and (b) vacuum means for providing a vacuum in the chamber means through the holes in the conductive second plate.

11. The apparatus of claim 10 wherein a static magnetic field is provided around the plasma in the electrically insulated chamber means.

12. The apparatus of claim 10 wherein an electrically conductive outer tube surrounds the conductive first plate, the disk and the first and second tubes.

13. The apparatus of claim 12 wherein the disk and outer conductive tube are made of stainless steel.

14. The apparatus of claim 12 wherein the outer tube has a circular cross-section.

15. The apparatus of claim 14 wherein the disk is spaced from the outer conductive tube.

16. The apparatus of claim 14 wherein the disk contacts an inner surface of the conductive tube.

17. The apparatus of claim 10 wherein the chamber means, probe means, the moveable metal plate means and coupler means are circular in cross-section perpendicular to the central longitudinal axis of the coupler means and the chamber means and wherein the disk, conductive plate and first and second tubes have circular cross-sections perpendicular to the longitudinal-axis.

18. The apparatus of claim 17 wherein the chamber means and the first and second tubes are quartz.

19. The apparatus of any one of claims 1 or 10 wherein the disk is made of graphite.

20. A method for treating a substrate which comprises:

(a) providing a plasma generating apparatus for treating a substrate including a plasma source employing a radiofrequency, including UHF or microwave, wave coupler means which is metallic and in the shape of a hollow cavity and which is excited in a mode of resonance in an electrically insulated chamber means mounted in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radiofrequency wave applied to the coupler means creates and maintains the plasma around the central longitudinal axis in the chamber means; and a stage means which forms part of the cavity and projects into the chamber means at the one end and provides for mounting a substrate on the chamber means, the stage means having a support surface which is in a plane around the longitudinal axis, the improvement in the stage means which comprises:

an electrically conductive support plate with an upper surface for supporting the substrate and an opposed lower surface;

an electrically non-conductive first tube with a first end which mounts the conductive support plate on the lower surface;

a conductive disk with opposed sides with the first tube mounted on one of the opposed sides;

an electrically non-conductive second tube mounted on the disk on the other of the opposed sides; and a conductive base plate which mounts the conductive second tube and having circumferentially positioned holes adjacent an outside wall of the second tube allowing flow of the gas and preventing radiofrequency waves from escaping through the holes, wherein the wave coupler means can be positioned so that the plasma is contacting the substrate and is off of the stage means except at the conductive base plate; and (b) treating the substrate with the plasma, wherein the stage means projects into the chamber means and wherein the wave coupler means is positioned so that the plasma is contacting the substrate.

21. A method for treating a substrate which comprises:

(a) providing a plasma generating applicator in a plasma generating apparatus for treating a substrate including a plasma source employing a radiofrequency, including UHF or microwave, wave coupler means which is metallic and in the shape of a hollow cavity and which is excited in a TM mode of resonance in an electrically insulated chamber means mounted in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radiofrequency wave applied to the coupler means creates and maintains the plasma around the central longitudinal axis in the chamber means; movable metal plate means in the cavity mounted in the coupler means perpendicular to the central longitudinal axis and movable along the central longitudinal axis towards and away from the chamber means; and a movable probe means connected to and extending inside the coupler means for coupling the radiofrequency waves to the coupler means, wherein the probe means which is elongate and is mounted in the coupler means along the central longitudinal axis of the chamber means and coupler means, with an end of the probe means in spaced relationship to the chamber means and wherein the moveable metal plate means having an opening along the central longitudinal axis of the chamber means, wherein the moveable metal plate means supports the probe means so that the probe means can be moved in the opening in the moveable metal plate means along the central longitudinal axis the improvement which comprises: a stage means which forms part of the cavity and provides for mounting a substrate to be treated with the material, the stage means comprising an electrically conductive first plate with an upper surface for supporting the substrate and an opposed lower surface having a central portion which projects away from the lower surface; an electrically non-conductive first tube with opposed ends with a first of the ends mounting the conductive first plate with the central portion projecting into the first tube; a conductive disk with opposed sides and with central opposed raised portions so that one of the raised portions projects into the first tube; an electrically non-conductive tube mounted on the conductive disk so that the other of the raised portions projects into the second tube; an electrically conductive second plate which supports the second tube with a central portion having a recess which mounts a portion of the second tube, the conductive second plate having circumferentially positioned holes adjacent an outside wall of the second tube allowing flow of the gas and preventing radiofrequency waves from escaping through the holes, wherein the stage means projects into the chamber means and wherein the probe means and the moveable metal plate means can be positioned so that the plasma is contacting the substrate and is off of the stage means except at the conductive first plate; and vacuum means for providing a vacuum in the chamber means through the holes in the conductive second plate;

(b) treating the substrate with the plasma, wherein the stage means projects into the chamber means and wherein the probe means and the movable metal plate means are positioned so that the plasma is contacting the substrate.

22. The method of claim 21 wherein the apparatus is tuned to mode selected from the group consisting of $TM_{o11}$ and $TM_{o13}$.

* * * * *

UNITED STATES PATENT AND TRADEMARK OFFICE
CERTIFICATE OF CORRECTION

PATENT NO. : 5,736,818
DATED : April 7, 1998
INVENTOR(S) : Michael J. Ulczynski, Donnie K. Reinhard and Jes Asmussen It is certified that error appears in the above-indentified patent and that said Letters Patent is hereby corrected as shown below:

Column 3, line 35, "(1/16 to inch)" should be --(1/16 to 1/4 inch).

Column 6, line 13, "chamber The tubes" should be --chamber 40. The tubes--.

Column 9, line 42 (Claim 1), "LIEF" should be --UHF--.

Column 10, line 34 (Claim 10), "LIEF" should be --UHF--.

Signed and Sealed this

Twenty-first Day of July, 1998

Attest:

Attesting Officer

BRUCE LEHMAN

Commissioner of Patents and Trademarks